United States Patent
Onishi et al.

(10) Patent No.: US 6,740,528 B2
(45) Date of Patent: May 25, 2004

(54) METHOD FOR MEASURING CONCENTRATION OF STABLE FREE RADICAL COMPOUND

(75) Inventors: Norihiko Onishi, Mie (JP); Hiroshi Kurumado, Mie (JP); Yoshiharu Yamaguchi, Mie (JP)

(73) Assignee: Hakuto Co., Ltd., Tokyo (JP)

( * ) Notice: Subject to any disclaimer, the term of this patent is extended or adjusted under 35 U.S.C. 154(b) by 194 days.

(21) Appl. No.: 09/941,747

(22) Filed: Aug. 30, 2001

(65) Prior Publication Data

US 2002/0048820 A1 Apr. 25, 2002

(30) Foreign Application Priority Data

Sep. 4, 2000 (JP) .................................. 2000-267004

(51) Int. Cl.[7] .............................................. G01N 24/00
(52) U.S. Cl. ............................ 436/173; 436/85; 436/106
(58) Field of Search .......................... 436/173, 85, 106

(56) References Cited

U.S. PATENT DOCUMENTS

| 3,966,744 A | 6/1976 | Goldstein et al. |
| 5,449,724 A | 9/1995 | Moffat et al. |
| 5,725,839 A | 3/1998 | Hsia |
| 5,780,257 A | 7/1998 | Aoyama et al. |
| 5,811,305 A | 9/1998 | Ono et al. |
| 5,880,230 A | 3/1999 | Syrinek et al. |
| 6,384,267 B1 * | 5/2002 | Shingai et al. ............ 560/209 |

OTHER PUBLICATIONS

Veregin et al. "Free Radical Polymerization for Narrow Polydispersity Resins: Electron Spin Resonance Studies of the Kinetics and Mechanism", Macromolecules, 1993, v. 26, pp. 5316–5320.*

Veregin et al., "Mechanism of Living Free Radical Polymerizations with Narrow Polydispersity: Electron Spin Resonance and Kinetic Studies", Macromolecules, 1995, 28(13), 4391–8.*

MacLeod et al. "Electron spin resonance studies of the stable free-radical polymerization of styrene", Macromolecules, 1998, 31(2), 530–531.*

Chalfont we al., "A Probe for Homolytica Reactions in Solutins. II. The Polymerization of Styrene", J. Am. Chem. Soc., 1968, 90 (25), pp. 7141–7142.*

* cited by examiner

Primary Examiner—Jill Warden
Assistant Examiner—Yelena G. Gakh
(74) Attorney, Agent, or Firm—Sughrue Mion, PLLC

(57) ABSTRACT

In a process of treating a radical polymerizable compound containing a stable free radical compound, there is provided a method for measuring the concentration of the stable free radical compound rapidly and with high precision, from the absorption intensity of electron spin resonance.

6 Claims, 1 Drawing Sheet

Concentration of 4-hydroxy-2,2,6,6-tetramethylpiperidine-1-oxyl (ppm)

METHOD FOR MEASURING CONCENTRATION OF STABLE FREE RADICAL COMPOUND

FIELD OF THE INVENTION

The present invention relates to a method for measuring the concentration of a stable free radical compound in a fluid in a process of treating a radical polymerizable compound containing the stable free radical compound.

BACKGROUND OF THE INVENTION

Radical polymerizable compounds such as ethylene, propylene, butadiene, acrylic acid, acrylates, methacrylic acid, methacrylates, acrylonitrile, methacrylonitrile, styrene, maleic acid and vinyl acetate, or mixtures containing two or more of them proceed in radical polymerization by the action of heat, peroxides, metal ions and the like to produce polymerized products, which adhere to distilling columns, reaction columns, heat exchangers such as reboilers, liquid transportation pipes, and the inner parts of apparatuses to result in serious operational obstacles such as a reduction in heat conductivity and clogging of the liquid transportation pipes. According to circumstances, it becomes necessary to interrupt the operation and remove the polymerized products, which sometimes causes consumption of huge cost and time.

For solving this problem, methods of inhibiting polymerization by addition of polymerization inhibitors have been used. As the polymerization inhibitors, there have been widely used aromatic amine compounds, hydroxylamine compounds, phenol compounds, quinone compounds and nitrous acid compounds. In recent years, however, attention has been focused on stable free radical compounds having steric hindrance groups represented by 2, 2, 6, 6-tetramethylpiperidine-1-oxyl because of their extremely high polymerization inhibition effect.

The polymerization inhibition of polymerizable unsaturated compounds by N-oxyl compounds has been disclosed in Japanese Patent 2818977 (corresponding to WO96/16921), JP-B-4-26639 (corresponding to WO87/04179), JP-A-10-1505, JP-A-10-158313, JP-A-10-182545, JP-A-10-182605, U.S. Pat. No. 5,880,230 and JP-A-11-222462 (The term "JP-A" as used herein means an "unexamined published Japanese patent application" and the term "JP-B" as used herein means an "examined Japanese patent publication").

The stable free radical compounds scarcely react with each other because three-dimensionally large groups are adjacent to radicals in the stable free radical compounds, but can rapidly react with radicals from the radical polymerizable compounds to inhibit polymerization. The consumption of the radicals of the stable free radical compounds thus proceeds, so that the polymerization inhibition effect is lost in the state of insufficient concentration, resulting in the same state that no polymerization inhibitor is added. Industrially, from the viewpoint of safety operation, the stable free radical compounds are used in large amounts in many cases, and added exceeding a required amount, which raises an economical problem. A method has therefore been eagerly desired by which the concentration of the stable free radical compounds can be measured for a short period of time so that the compounds can be added depending on fluctuations in process conditions.

It has been disclosed in Bis [3-tert-butyl-5-(N-oxy-tert-butylamino)phenyl]Nitroxide in a Quartet Groud States; A Prototype for Persistent High-Spin Poly [(oxyimino)-1,3-phenylenes], T. Ishida, H. Iwamura (J. Am. Chem. Soc. 113, 4238–4241 (1991)), U.S. Pat. Nos. 5,780,257 and 5,811,305 that the stable free radical compound can be measured by means of electron spin resonance.

SUMMARY OF THE INVENTION

An object of the invention is to provide a method for measuring the concentration of a stable free radical compound quickly and with high precision.

As a result of intensive studies of methods for measuring the concentration of stable free radical compounds, the present inventors have found that electron spin resonance (hereinafter referred to as "ESR") method is simplest and can determine the concentration with sufficient precision, and achieved the invention.

That is to say, a gist of the invention is a method for measuring a stable free radical compound by electron spin resonance method in a process of treating a radical polymerizable compound containing the stable free radical compound, and another gist of the invention is the method as described above, wherein the stable free radical compound is a 2, 2, 6, 6-tetramethylpiperidine-1-oxyl compound.

DETAILED DESCRIPTION OF THE INVENTION

Figure 1:
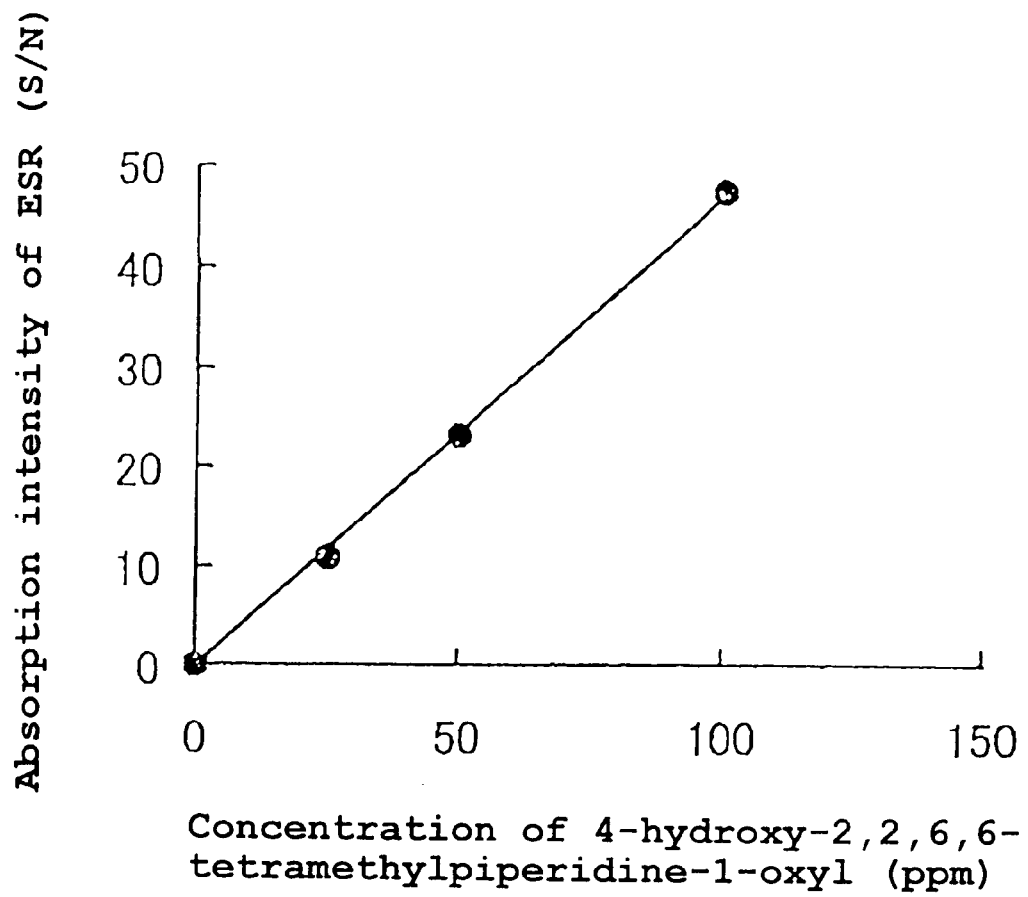
FIG. 1 is a graph showing the relationship between the concentration (ppm) of 4-hydroxy-2, 2, 6, 6-tetramethylpiperidine-1-oxyl and the absorption intensity of ESR.

The stable free radical compounds are N-oxyl radical compounds which can be stably treated at ordinary temperature in the presence of air, and also include 2, 2, 6, 6-tetramethylpiperidine-1-oxyl compounds, 2, 2, 5, 5-tetramethylpyrrolidine-1-oxyl compounds and further compounds in which a plurality of N-oxyl groups exist in one molecule by linking a plurality of 2, 2, 6, 6-piperidine-1-oxyl or 2, 2, 5, 5-pyrrolidine-N-oxyl molecules by dibasic acids or the like. Specific examples of the 2, 2, 6, 6-tetramethylpiperidine-1-oxyl compounds include 2, 2, 6, 6-tetramethylpiperidine-1-oxyl, 4-hydroxy-2, 2, 6, 6-tetramethylpiperidine-1-oxyl, 4-oxo-2, 2, 6, 6-tetramethylpiperidine-1-oxyl, 4-methoxy-2, 2, 6, 6-tetramethylpiperidine-1-oxyl, 4-carboxy-2, 2, 6, 6-tetramethylpiperidine-1-oxyl, 4-carboxamido-2, 2, 6, 6-tetramethylpiperidine-1-oxyl, bis-(2, 2, 6, 6-tetramethylpiperidine-1-oxyl)succinates and tris-(2, 2, 6, 6-tetramethylpiperidine-1-oxyl) phosphites, and specific examples of the 2, 2, 5, 5-tetramethylpyrrolidine-1-oxyl compounds include 2, 2, 5, 5-tetramethylpyrroli-dine-1-oxyl and 3-hydroxy-2, 2, 5, 5-tetramethylpyrrolidine-1-oxyl.

The radical polymerizable compounds for use in the invention are ethylene, propylene, styrene, acrylonitrile, methacrylonitrile, acrylic acid, acrylates, methacrylates, acrylamide, methacrylamide, maleic acid and vinyl acetate, and further include diene compounds such as butadiene and isoprene.

The systems in which the radical polymerizable compounds for use in the invention are treated are the stages of producing, purifying, storing and transporting the radical polymerizable compounds, and specifically distilling columns, fractionating columns and storage tanks.

ESR is the phenomenon that an electron spin placed in a static magnetic field resonates by application of a microwave, and the concentration of the stable free radical compound can be estimated by detecting an unpaired electron, that is to say, the radical compound, and utilizing that the absorption intensity of the microwave is proportional to the radical concentration.

ESR can measure only the stable radical compound selectively and with high sensitivity, with no special pretreatment to a sample to be measured, without being substantially affected by another coexisting compound.

There is no particular limitation on an ESR measuring apparatus for use in the invention. For example, however, an apparatus is used in which a magnetic circuit, a microwave circuit, an electronic circuit and a computer system for control of measurement and for signal conditioning are placed in a small-sized box. As such an apparatus, there can be used a commercially available apparatus, for example, an "ES-10W" ESR measuring apparatus manufactured by Nikkiso Co., Ltd.

The measurement of ESR is usually made by collecting a small amount of a sample from a subject process, and transferring this to a measuring cell in the ESR measuring apparatus. It is also possible to make the measurement by providing a bypass line in a process fluid of the distilling column or the fractionating column, for example, arranging a three-way electromagnetic valve in the midst of the bypass line and setting a timer, continuously or periodically collecting the process fluid, and transferring the fluid to the measuring cell in the ESR measuring apparatus.

In the subject system of the invention, radicals derived from the stable free radical compound and radicals derived from the radical polymerizable compounds are present. The radicals derived from the stable free radical compound are stably present. However, the radicals derived from the radical polymerizable compounds are unstable and extremely short in life, so that they can not be substantially detected by the ESR measurement of the invention conducted at ordinary temperature. Accordingly, the radicals detected by the ESR measurement of the invention may be considered to be only the radicals derived from the stable free radical compound.

The concentration of the stable free radical compound can also be measured by gas chromatography or liquid chromatography. In the measurement by gas chromatography or liquid chromatography, however, the measurement of the process fluid in the as-collected state is influenced by other organic compounds existing in overwhelming large amounts. It is therefore substantially impossible to use the stable free radical compound contained in extremely small amounts for quantitative determination.

The water-soluble stable free radical compound such as 4-hydroxy-2, 2, 6, 6-tetramethylpiperidine-1-oxyl can be separated from the other coexisting organic compounds by extraction with water, and then condensed. However, such pretreatment not only is operationally troublesome, but also brings about increased errors. As to the stable free radical compound which is not soluble in water, it is substantially impossible to separate it from the coexisting organic compounds and then condense it, and the quantitative determination by gas chromatography or liquid chromatography is difficult.

On the other hand, the ESR measuring apparatus is an apparatus for measuring electron spins of radicals, which can selectively measure only the radicals independently of the composition of the subject to be measured, and moreover, is extremely sensitive, so that it has the great advantage that the fluid collected from the process can be subjected to the measurement as it is without pretreatment of the collected sample. The precision is of course heightened.

The present invention will be further illustrated in greater detail with reference to the following examples, which are, however, not to be construed as limiting the invention.

EXAMPLE 1

Specified amounts of 4-hydroxy-2, 2, 6, 6-tetramethyl-piperidine-1-oxyl were dissolved in xylene, and the ESR spin intensities were measured for respective concentrations with an ESR measuring apparatus ("ES-10W": manufactured by Nikkiso Co., Ltd.).

The concentrations of 4-hydroxy-2, 2, 6, 6-tetramethyl-piperidine-1-oxyl and results of determination of the ESR absorption intensities are shown in Table 1 and FIG. 1.

TABLE 1

| Concentration of Stable Free Radical Compound (ppm) | ESR Absorption Intensity (S/N) |
|---|---|
| 0 | 10 |
| 25 | 10.7 |
| 50 | 23.1 |
| 100 | 47.5 |

Utilizing these results, the concentration of 4-hydroxy-2, 2, 6, 6-tetramethylpiperidine-1-oxyl can be estimated from the ESR absorption intensity.

EXAMPLE 2

At varying times, five samples were collected from a dipropanizer bottom stream in an ethylene distillation process using 4-hydroxy-2, 2, 6, 6-tetramethylpiperidine-1-oxyl as a stable free radical compound, and the quantitative determination of the invention by ESR (ESR method) and the conventional quantitative determination by gas chromatography (gas chromatography method) were conducted.

Outlines of procedures for measuring the concentration of the free radical compound by the ESR method and gas chromatography method are shown in Table 2.

TABLE 2

| | ESR Method | Gas Chromatography Method |
|---|---|---|
| Sampling | Collected weight = A (g) | The sample was collected from the process, and the weight thereof was measured, followed by exposure to atmospheric pressure. Collected weight = A (g) |
| Concentration of Sample | Unnecessary | The collected sample was condensed with an evaporator. Weight after condensation = B (g) |
| Extraction | Unnecessary | C (g) of the condensed sample was taken, and placed in a separatory funnel. Then, 25 ml of ion-exchanged water was added to conduct extraction. |
| Washing | Unnecessary | An aqueous layer after extraction was placed in another separatory funnel, and oil components were extracted with 10 ml of n-hexane and washed. |
| Dilution | The collected sample was placed in a volumetric flask, and xylene was added to bring the weight to 100 g. | The resulting aqueous layer was placed in a volumetric flask, and ion-exchanged water was added to bring the volume to 50 ml. |

TABLE 2-continued

| | ESR Method | Gas Chromatography Method |
|---|---|---|
| Measurement | D (g) of the xylene-diluted solution was taken, the absorption intensity was measured, and the quantitative determination was conducted using a calibration curve. Measured value = F (mg/kg) | The quantitative determination was conducted using an adjusted column and a calibration curve separately prepared from measurement peaks. Measured value = E (mg/kg) |
| Calculation | F × 100/(A × D) | E × (50 × B)/(A × C) |
| Time Required | About 20 minutes Adjustment of apparatus: about 15 minutes | About 90 minutes Adjustment of apparatus: about 2 hours |

Results of measurement are shown in Table 3.

TABLE 3

| Sampling No. | Measured Value by ESR Method (ppm) | Measured Value by Gas Chromatography Method (ppm) |
|---|---|---|
| 1 | 10.4 | 14.0 |
| 2 | 13.6 | 12.2 |
| 3 | 19.2 | 16.3 |
| 4 | 14.1 | 16.1 |
| 5 | 14.6 | 12.7 |

A slight difference is observed in the measured value between the quantitative determination by ESR and the quantitative determination by gas chromatography. However, considering that it is important to confirm that the stable free radical compound remains to some extent or more, both methods are sufficiently satisfactory in terms of process control. However, considering the time and labor required for measurement, it is known that the method by ESR is markedly excellent from the viewpoint of measurement operation.

EXAMPLE 3

At varying times, five samples were collected from a dipropanizer bottom stream in an ethylene distillation process containing 4-hydroxy-2, 2, 6, 6-tetramethyl-piperidine-1-oxyl as a stable free radical compound, in the same manner as with Example 2, and the quantity of the free radical compound was determined by the ESR method and the gas chromatography method.

Results thereof are shown in Table 4.

TABLE 4

| Sampling No. | Measured Value by ESR Method (ppm) | Measured Value by Gas Chromatography Method (ppm) |
|---|---|---|
| 1 | 20.9 | 18.9 |
| 2 | 23.7 | 22.6 |
| 3 | 21.5 | 16.7 |
| 4 | 25.3 | 22.1 |
| 5 | 19.6 | 18.4 |

According to the invention, in the process of treating the radical polymerizable compound containing the stable free radical compound, the concentration of the stable free radical compound can be measured simply and with high precision, and excess addition is avoided. Further, it becomes possible to ensure the inhibition of polymerization, and a big contribution is made to stable operation of relating equipment.

While the invention has been described in detail and with reference to specific embodiments thereof, it will be apparent to one skilled in the art that various changes and modifications can be made therein without departing from the spirit and scope thereof.

What is claimed is:

1. A method for measuring the concentration of piperidine-1-oxyl compound by electron spin resonance method in a process of producing, purifying, storing and/or transporting a radical-polymerizable compound employing the piperidine-1-oxyl stable free radical compound, comprising:

a) providing a continuous system including an apparatus for producing or purifying the radical-polymerizable compound employing the piperidine-1-oxyl stable free radical compound in said apparatus;

b) connecting said apparatus to a three-way valve which is connected to a fluid by-pass line of said continuous system;

c) collecting, continuously or periodically, a sample from said process by said three-way electromagnetic valve; and d) transferring the sample to a measuring cell in a small-sized electron spin resonance measuring apparatus with a permanent magnet.

2. The method according to claim 1, wherein the piperidine-1-oxyl compound is a 2,2,6,6-tetramethylpiperidine-1-oxyl compound.

3. The method according to claim 1, wherein said radical-polymerizable compound is selected from the group consisting of ethylene, propylene, styrene, acrylonitrile, methacrylonitrile, acrylic acid, acrylates, methacrylates, acrylamide, methacrylamide, maleic acid and vinyl acetate.

4. The method according to claim 2, wherein said 2,2,6,6-tetramethylpiperidine-1-oxyl compound is selected from the group consisting of 4-hydroxy-2,2,6,6-tetramethylpiperidine-1-oxyl, 4-oxo-2,2,6,6-tetramethylpiperidine-1-oxyl, 4-methoxy-2,2,6,6-tetramethylpiperidine-1-oxyl, 4-carboxy-2,2,6,6-tetramethylpiperidine-1-oxyl, 4-carboxamido-2,2,6,6-tetramethylpiperidine-1-oxyl, bis(2,2,6,6-tetramethylpiperidine-1-oxyl)succinate and tris(2,2,6,6-tetramethylpiperidine-1-oxyl) phosphate.

5. The method according to claim 1, wherein the sample is collected periodically.

6. The method according to claim 1, wherein said process uses at least one apparatus selected from the group consisting of a distilling column and a fractionating column.

* * * * *